(12) United States Patent
Lee et al.

(10) Patent No.: US 8,318,411 B2
(45) Date of Patent: Nov. 27, 2012

(54) METHOD FOR FABRICATING AN INTERPOSER

(75) Inventors: Chang-Ming Lee, Taoyuan County (TW); Wen-Fang Liu, Taoyuan County (TW); Shih-Jung Huang, Taoyuan County (TW); Ling-Kai Su, Taipei (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 266 days.

(21) Appl. No.: 12/837,462

(22) Filed: Jul. 15, 2010

(65) Prior Publication Data

US 2012/0015304 A1   Jan. 19, 2012

(51) Int. Cl.
*G03F 7/26* (2006.01)
(52) U.S. Cl. .......................................... 430/315
(58) Field of Classification Search ............. 430/311, 430/315
See application file for complete search history.

(56) References Cited

U.S. PATENT DOCUMENTS 7,371,073 B2   5/2008   Williams

FOREIGN PATENT DOCUMENTS

TW   I294758   3/2008

*Primary Examiner* — Kathleen Duda
(74) *Attorney, Agent, or Firm* — Winston Hsu; Scott Margo

(57) ABSTRACT

Method for fabricating an interposer is provided. A substrate is provided having thereon at least a conductive via and at least a flange. The flange is bonded on the substrate and shades a portion of the via. A photoresist layer is formed on the interior surface of the via, on a contact surface of the flange and on an inner surface of the flange opposite to the contact surface. An opening is formed in the photoresist layer to expose a portion of the contact surface of the flange, while the photoresist layer still covers the interior surface of the via and the inner surface of the flange. A plating layer is formed on the exposed contact surface of the flange. The photoresist layer is then removed.

9 Claims, 3 Drawing Sheets

METHOD FOR FABRICATING AN INTERPOSER

BACKGROUND OF THE INVENTION

1. Field of the Invention

The present invention relates to a method for fabricating a connector or an interposer, more particularly, to a method for fabricating a connector or an interposer that can decrease the consumption of gold by using positive-type photoresist.

2. Description of the Prior Art

Multi-functional and miniature electronic products have become a trend in electronic product development. In practice, each function generally must be realized in an independent chip. In other words, multi-function applications require multiple-chip solutions. However, if connections between independent chips are formed in a printed circuit board (PCB), a size of an electronic product inevitably grows. In order to improve on the problem, the integration of system in a package (SIP) therefore prevails. The main idea of the SIP is to set a plurality of chips that form a multi-function application on an interposer, such that connections between each of the plurality of chips occur across the interposer. Furthermore, the aforementioned chips and the interposer are packaged together to form a system package structure, and chips are electrically connected to one another through a conductive pattern inside the micro interposer. Furthermore, the system package structure is then bonded onto a printed circuit board via a plurality of conductive bumps or different types of leads to form a complete electrical system with other active electrical components or passive electrical components to effectively enable the operation in a variety of electronic products.

Current commercial interposer usually includes a substrate having a via penetrating through the two opposite surfaces of the substrate, and a connection component for external connecting the chip or other active or passive electronic components. It is noted that a gold layer is usually coated on the contacting area which is used for connecting the interposer to the chips or other active or passive electronic components, so as to increase the electrical conductivity or wear resistance of the connection component relatively to the chips or other active or passive electronic components.

In manufacture, the gold is selectively formed on the connection component by using a negative-type photoresist in conventional arts. However, by using the negative-type photoresist, due to the 3D obstruction of the connection component, a portion of the photoresist on the connection component, the substrate and the interior surface of the via are not exposed to light. After the development process, this portion of photoresist is stripped away. In the subsequent plating process, the gold is widely plated on these non-functional areas which are not subjected to light exposure. It therefore leads to more gold consumption in conventional arts because of the great areas of gold plating on the connection component. Moreover, when using the negative-type photoresist in conventional arts, the exposure and development processes should be carried out respectively upon the two opposite surfaces of the interposer. The use of two exposure and development processes renders the plating process more complicated and thus increases the costs and production time.

Accordingly, conventional method that uses the negative-type photoresist for plating the gold not only causes the waste of gold, but also requires two exposure processes to complete the gold plating process on the interposer.

SUMMARY OF THE INVENTION

The present invention therefore provides a method for manufacturing an interposer to reduce the waste of gold plating and simplify the plating process.

The present invention provides a method for manufacturing an interposer. A substrate is provided having thereon at least a conductive via connecting a first surface of the substrate and a second surface opposite to the first surface, and a flange bonded at least on one of the first and second surfaces of the substrate. The flange shades at least a portion of the conductive via and includes a contact surface facing an external mounting component. Then a photoresist layer is formed on an interior surface of the conductive via, the first surface, the second surface and the flange. Next, the substrate is subjected to an exposure process and a development process is performed to form an opening in the photoresist layer to expose a portion of the contact surface of the flange. Subsequently, a plating process is performed to form a plating layer within the opening on the contact surface of the flange. Lastly, the photoresist layer is stripped away.

The present invention further provides a method for fabricating an interposer. A substrate is provided having thereon at least a conductive via and at least a flange. The flange is bonded on the substrate and shades a portion of the conductive via. A photoresist layer is formed on the interior surface of the conductive via, on a contact surface of the flange and on an inner surface of the flange opposite to the contact surface. An opening is formed in the photoresist layer to expose a portion of the contact surface of the flange, while the photoresist layer still covers the interior surface of the conductive via and the inner surface of the flange. A plating layer is formed on the exposed contact surface of the flange. The photoresist layer is then removed.

In one embodiment of the invention, the photoresist layer is a positive-type photoresist. In another embodiment, the photoresist layer is a plating photoresist. The flange is bonded on the substrate by an adhesive layer. The flange is made of conductive material. The flange includes an arm portion and a base portion where the base portion is fixed on the substrate by the adhesive layer.

In one embodiment of the present invention, the plating layer includes gold. The plating layer is not formed on the interior surface of the conductive via and the inner surface opposite to the contact surface of the flange. Besides, after the exposure process is carried out upon the first surface of the substrate, no other exposure process is carried out upon the second surface of the substrate.

In light of above, the present invention provides a method for manufacturing an interposer, which uses a positive-type photoresist to form the photoresist layer. In such way, a large portion of photoresist layer on the interposer can be retained while a small portion of photoresist is remove, such as those on the top portion of the flange, the contacting areas of the chip, the carrier or other electronic components, where gold is plated thereon in the subsequent plating process, thus reducing the amount of gold plating. In addition, since the positive-type photoresist layer is retained after exposure, only one exposure process is required to complete the process of gold plating, thus simplifying the process.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
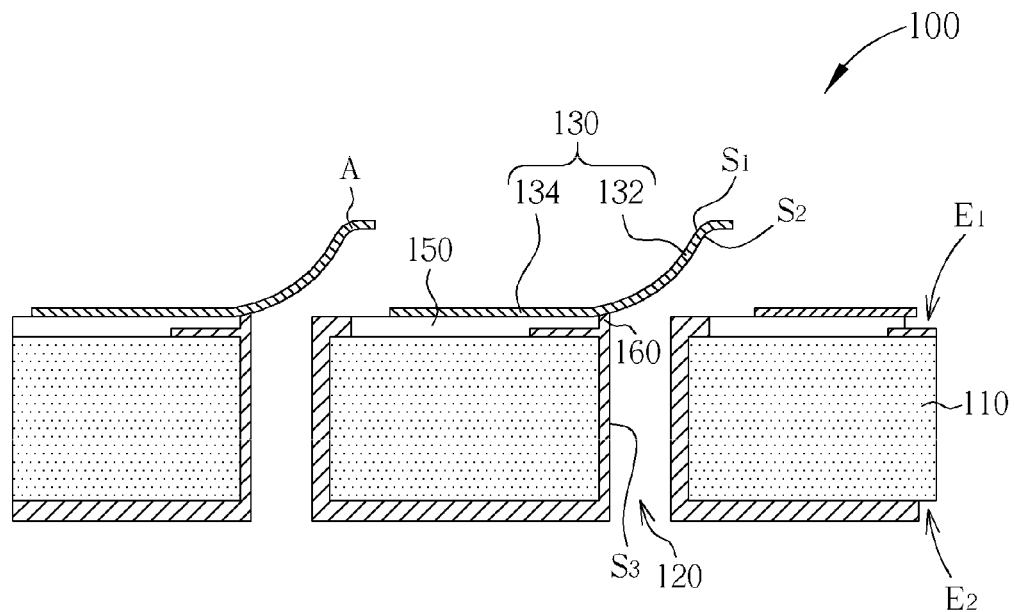
FIGS. 1A-1F are cross-sectional diagrams illustrating the method for manufacturing an interposer according to one preferred embodiment of the present invention.
Figure 1B:
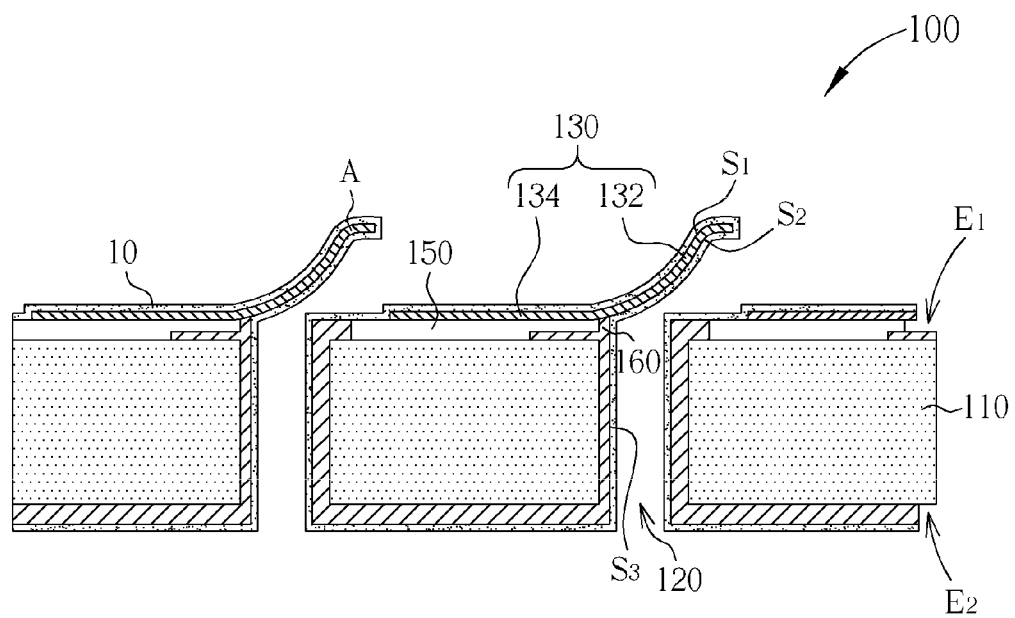
Figure 1C:
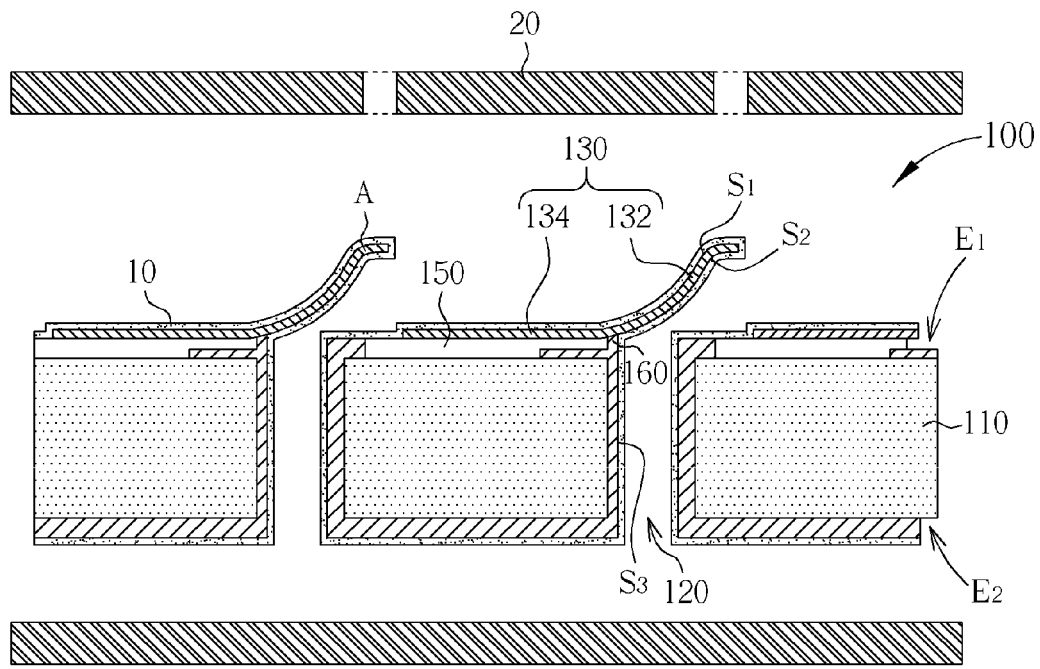
Figure 1D:
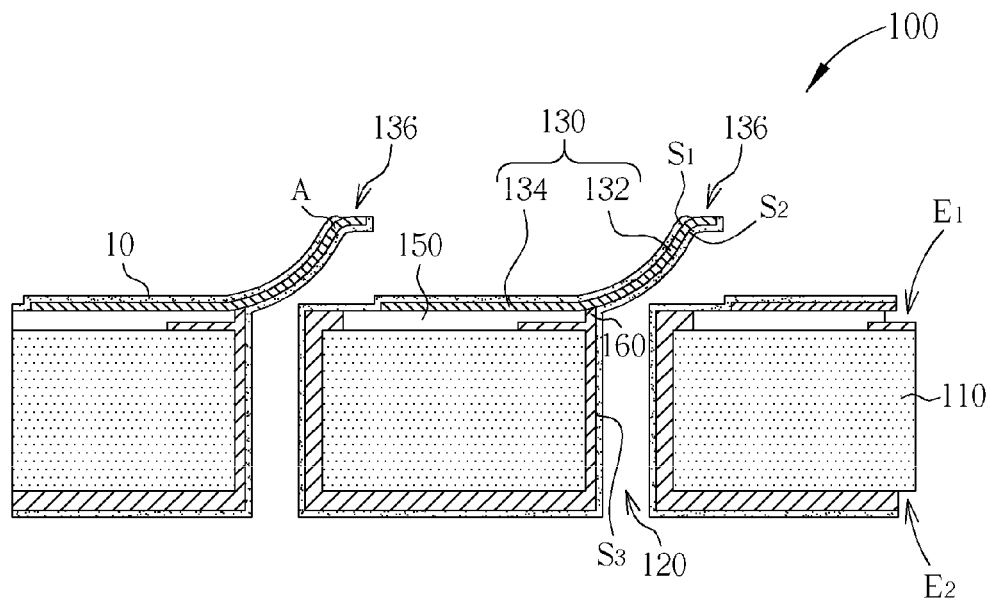
Figure 1E:
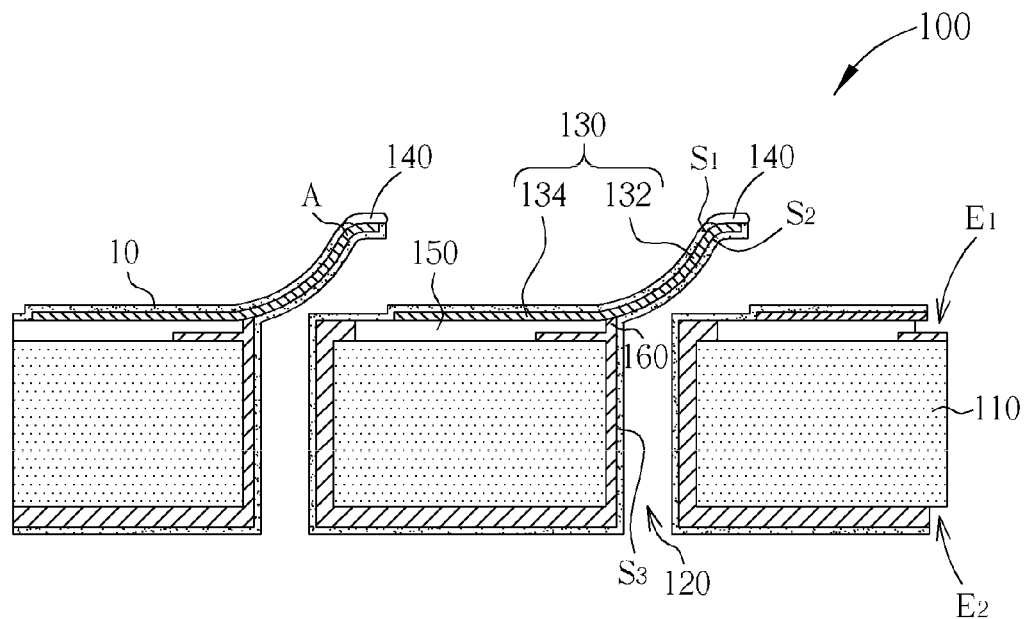
Figure 1F:
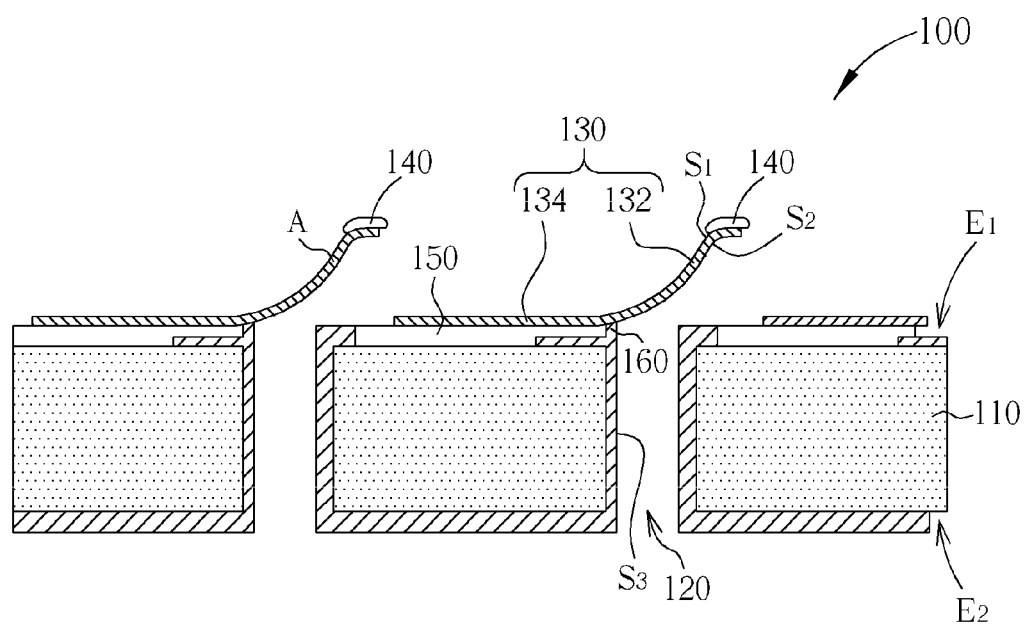

FIGS. 1A-1F are cross-sectional diagrams showing the method for manufacturing an interposer according to one preferred embodiment of the present invention. Referring to FIG. 1F, firstly. The interposer 100 in the present embodiment includes a surface for connecting at least a chip, a package carrier or a flexible circuit board (not shown), and an opposite surface for being supported by a circuit board (not shown) thereon such that the chip can be connected to other active or passive components by the interposer 100 to form an electronic system when miniaturizing the electronic products. In another embodiment, both surfaces of the interposer 100 can connect the active or passive electronic components, and should not be limited thereto.

In detail, the interposer 100 includes a substrate 110 having thereon at least a conductive via 120 penetrating through the substrate 110 to connect a first surface E1 and a second surface E2 of the substrate no. At least one flange 130 is disposed on the first surface E1 of the substrate no. The flange 130 includes an arm portion 132 and a base portion 134. The base portion 134 is used for connecting the substrate no, and the arm portion 132 is used for connecting another component (not shown), such as a chip or a chip carrier, thereby making the chip electrically connected to other systems. A plating layer 140 is disposed on a top portion A of the arm portion 132. The plating layer 140 is usually made of gold and is coated on the top portion A by a plating process. That is, the plating layer 140 is coated on the contacting regions between the arm portion 130 and the chip, the package carrier, the flexible printed circuit board or other electronic components (not shown). The plating layer 140 can increase the electrical conductivity between the arm portion 130 and the chip carrier or other electronic components, as well as the wear resistance ability since the arm portion 132 is repeated to physically couple or electrically connect the chip, the package carrier, the flexible circuit boards or other electronic components. The plating layer 140 can also prevent the contacting regions from oxidation. It is worthy noted that, in conventional arts, the plating layer 140 such as a gold layer is usually formed on the top portion A of the arm portion 132 by a lithography process that uses a negative-type photoresist. Due to the property of the negative-type photoresist, the portion of the photoresist layer not exposed to light is removed from the areas where the gold is plated thereon in the subsequent plating steps. However, these areas are partly non-functional regions that do not require gold plating, so the gold is usually wasted in conventional arts. The present invention therefore provides a method to solve the problem of gold wasting during the plating process.

In the present embodiment, the substrate 110 includes a conductive via 120, or a plurality of conductive vias 120 disposed therein to co-operate with the flanges 130. The conductive via 120 penetrates through the substrate 110 to connect the first surface E1 and the second surface E2 of the substrate 110. However, in another embodiment, the conductive via 120 does not penetrate through the substrate 110. The flange 130 in the present embodiment is disposed only on the first surface E1 of the substrate no such that the flange 130 can physically couple or electrically connect the chip carrier by the arm portion 132. The second surface E2 of the interposer 100 can be supported by the circuit board through the solder balls, the conductive bumps or different types of leads. In another embodiment, the flange 130 can also be disposed on the second surface E2 of the substrate 110. That is, the flange 130 can be disposed both on the first surface E1 and the second surface E2 to physically couple or electrically connect to other electronic components, leaving these electronic components connected to each other to form an electronic system. The material of the plating layer 140 takes gold for example. However, the plating layer 140 can be other metal and should not be limited thereto.

The flange 130 may include, for example, copper, nickel, copper/nickel alloy, or a multi-layer composed of other conductive materials. The base portion 134 of the flange 130 can be mounted on the substrate 110 by an adhesive layer 150. In general, the flange 130 is fixed on the substrate 110 by the adhesive layer 150 via the base portion 134. The adhesive layer 150 usually insulates the flange 130 from the substrate 110. Accordingly, a metal layer 160 is used to electrically connect the conductive via 120 in the substrate 110 and the flange 130. The metal layer 160 is plated within the conductive via 120 of the substrate 110, the base portion 134 of the flange 130 and the contacting regions of the arm portion 132, that is, an outer area of the adhesive layer 150 between the substrate 110 and the flange 132, such that the chip or carrier on the top portion A of the flange 130 can be electrically connected by the metal layer 160. In one embodiment, the metal layer 160 can be a conductive copper layer. In another embodiment, the metal layer 160 can be other conductive materials but should not be limited thereto.

The method for manufacturing the interposer 100 according to the present embodiment is described below.

Please refer to FIGS. 1A-1F. The method for manufacturing the interposer 100 includes providing a substrate 110 having thereon at least a conductive via 120 to connect the first surface E1 and the second surface E2 of the substrate 110. At least a flange 130 including an arm portion 132 and a base portion 134 is mounted onto the substrate 110 by an adhesive layer 150, for example, a low-flow prepreg, and the base portion 134 is fixed onto the first surface E1 of the substrate 110 by pressing the base portion 134 and the adhesive layer 150. The flange 130 shades a portion of the conductive via 120 and includes a contact surface S1 facing an external mounting component and an inner surface S2 facing the conductive via 120 (as shown in FIG. 1A). Subsequently, a metal layer 160 is plated to electrically connect the conductive via 120 and the flange 130. Then, a photoresist layer 10 is formed on the interior surface S3 of the conductive via 120, the contact surface S1 and the inner surface S2 of the flange 130. The photoresist layer 10 includes positive-type photoresist. In another embodiment, the photoresist layer 10 includes plating photoresist which is formed conformally along the surface of three-dimensional structure (as shown in FIG. 1B). Next, an exposure process is performed upon the first surface E1 of the substrate 110 by using a patterned mask 20 (as shown in FIG. 1C), while no exposure process is performed upon the second surface E2 of the substrate no. Then, a development process is performed to form a plating hole (or an opening) 136 in the photoresist layer 10 to expose a portion of the contact surface S1 of the flange 130. Because the present invention uses the positive-type photoresist as the photoresist layer 10, after the development process, the photoresist layer 10 still covers the areas that are not exposed to light, such as the interior surface S3 of the conductive via 120 and the inner surface S2 of the flange (as shown in FIG. 1D). Subsequently, a plating process is performed to form a plating layer 140 within the opening 136 on the contact surface S1 of the flange 130. In the present embodiment, the material of the plating layer 140 is gold. In another embodiment, the material of the plating layer 140 can be other metal (as shown in FIG. 1E). Lastly, the photoresist layer 10 is stripped away (as shown in FIG. 1F).

It is noted that, the present invention uses the positive-type photoresist as the photoresist layer 10. Accordingly, after the exposure and development process, the photoresist layer 10 in the areas that require gold plating is removed away, for example, the areas on the top portion A of the flange 130, while the other portion of the photoresist layer 10 which is not directed to exposure process is retained. The gold is therefore plated only within the opening 136. In other words, the plating layer 140 is not formed on those non-functional areas such as the interior surface S3 of the conductive via 120 and the inner surface S2 of the flange 130. The present invention can therefore significantly reduce gold plating areas, and reduce the costs of material for gold. More specifically, according to experimental results, when the photoresist layer 10 which is conventionally the negative-type photoresist is replaced with the positive-type photoresist, 97% reduction of gold plating can be achieved, and thus a remarkable effect is obtained.

Since the positive-type photoresist is removed only on the areas which are exposed to light, the exposure process is carried out only upon the first surface E1 of the substrate 110. The second surface E2 of the substrate 110 requires no additional exposure processes. The objective of removing the photoresist layer 10 only on top portion A of the flange 130 but still retaining the photoresist layer on other areas is therefore achieved.

Comparing to conventional manufacturing method that uses the negative-type photoresist layer in lithography process where the exposure process is required to performed upon both the first surface E1 and the second surface E2 of the substrate 110, the present invention can streamline the process steps, thereby reducing the costs to perform the process.

In light of above, the present invention provides a method for manufacturing an interposer, which uses positive-type photoresist to form the photoresist layer. In such way, a large portion of photoresist layer on the interposer can be retained while a small portion of photoresist is remove, such as those on the top portion of the flange, the contacting areas of the chip, the carrier or other electronic components, where gold is plated thereon in the subsequent plating process, thus reducing the amount of gold plating. In addition, since the positive-type photoresist layer is retained after exposure, only one exposure process is required to complete the process of gold plating, thus simplifying the process.

Those skilled in the art will readily observe that numerous modifications and alterations of the device and method may be made while retaining the teachings of the invention.

What is claimed is:

1. A method for fabricating an interposer, comprising:
   providing a substrate comprising at least a conductive via and at least one flange disposed thereon, wherein the flange is bonded on the substrate and shades a portion of the conductive via;
   forming a photoresist layer on an interior surface of the conductive via, a contact surface of the flange and an inner surface opposite to the contact surface of the flange;
   forming an opening in the photoresist layer to expose a portion of the contact surface of the flange, while the photoresist layer still covers the interior surface of the conductive via and the inner surface of the flange;
   forming a plating layer within the opening on the exposed contact surface of the flange; and
   removing the photoresist layer.

2. The method for fabricating an interposer according to claim 1, wherein the photoresist layer comprises positive-type photoresist.

3. The method for fabricating an interposer according to claim 1, wherein the photoresist layer comprises plating photoresist.

4. The method for fabricating an interposer according to claim 1, wherein the flange is bonded on the substrate by an adhesive layer.

5. The method for fabricating an interposer according to claim 4, wherein the flange comprises an arm portion and a base portion.

6. The method for fabricating an interposer according to claim 1, wherein the exposure process is carried out upon the first surface of the substrate and no exposure process is carried out upon the second surface of the substrate.

7. The method for fabricating an interposer according to claim 1, wherein the flange is composed of conductive material.

8. The method for fabricating an interposer according to claim 1, wherein the plating layer comprises gold.

9. The method for fabricating an interposer according to claim 1, wherein the plating layer is not formed on the interior surface of the conductive via and an inner surface opposite to the contact surface of the flange.

* * * * *